(12) United States Patent
Suitou et al.

(10) Patent No.: US 7,239,553 B2
(45) Date of Patent: Jul. 3, 2007

(54) METHOD AND APPARATUS FOR REFERENCE CELL ADJUSTING IN A STORAGE DEVICE

(75) Inventors: Katsutoshi Suitou, Kawasaki (JP); Yoshichika Nakaya, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/344,677

(22) Filed: Jan. 31, 2006

(65) Prior Publication Data

US 2006/0233028 A1 Oct. 19, 2006

Related U.S. Application Data

(63) Continuation of application No. PCT/JP2005/001334, filed on Jan. 31, 2005.

(51) Int. Cl.
*G11C 16/28* (2006.01)
(52) U.S. Cl. .................. 365/185.22; 365/185.21; 365/185.2; 365/185.24
(58) Field of Classification Search ........... 365/185.21, 365/185.22, 185.2, 185.24
See application file for complete search history.

(56) References Cited

U.S. PATENT DOCUMENTS

| 5,682,346 | A | 10/1997 | Yamamura et al. .... 365/185.18 |
| 5,691,941 | A * | 11/1997 | Imamiya et al. ......... 365/185.3 |
| 6,205,056 | B1 | 3/2001 | Pan et al. ................. 365/185.2 |
| 6,621,742 | B1 * | 9/2003 | Yamada ................. 365/185.22 |
| 6,650,570 | B2 * | 11/2003 | Tanzawa et al. ....... 365/185.22 |
| 6,912,161 | B2 * | 6/2005 | Hirano et al. .......... 365/185.24 |

FOREIGN PATENT DOCUMENTS

| JP | 8-153398 | 6/1996 |
| JP | 8-329694 | 12/1996 |
| JP | 10-326495 | * 12/1998 |
| JP | 2000-100178 | 4/2000 |
| JP | 2003-527725 | 9/2003 |
| JP | 2003-323793 | 11/2003 |
| JP | 2004-192669 | 7/2004 |
| WO | WO 2006082619 A1 * | 8/2006 |

* cited by examiner

*Primary Examiner*—Andrew Q. Tran
(74) *Attorney, Agent, or Firm*—Ingrassia Fisher & Lorenz, P.C.

(57) ABSTRACT

When adjusting reference cells (11), the first reference unit (15) and the second reference unit (17) are used for verification operations of the reference cells (11). The first reference unit (15) provides a lower limit current of an allowable current range for currents provided from a nonvolatile transistor of the reference cells (11), and the second reference unit (17) provides an upper limit current therefor. An amplification signal REFO of the reference cells (11), which is outputted from a sense amplifier (19), is compared with amplification signals LO and HO responsive to the lower and upper limit currents outputted from sense amplifiers (21) and (23), respectively, and a verify operation is carried out to see whether or not the current provided from the nonvolatile transistor is between the lower limit current and the upper limit current of the allowable current range.

17 Claims, 7 Drawing Sheets

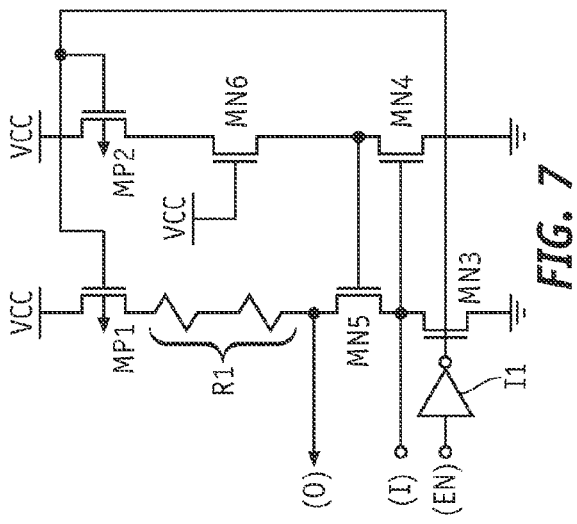
FIG. 5
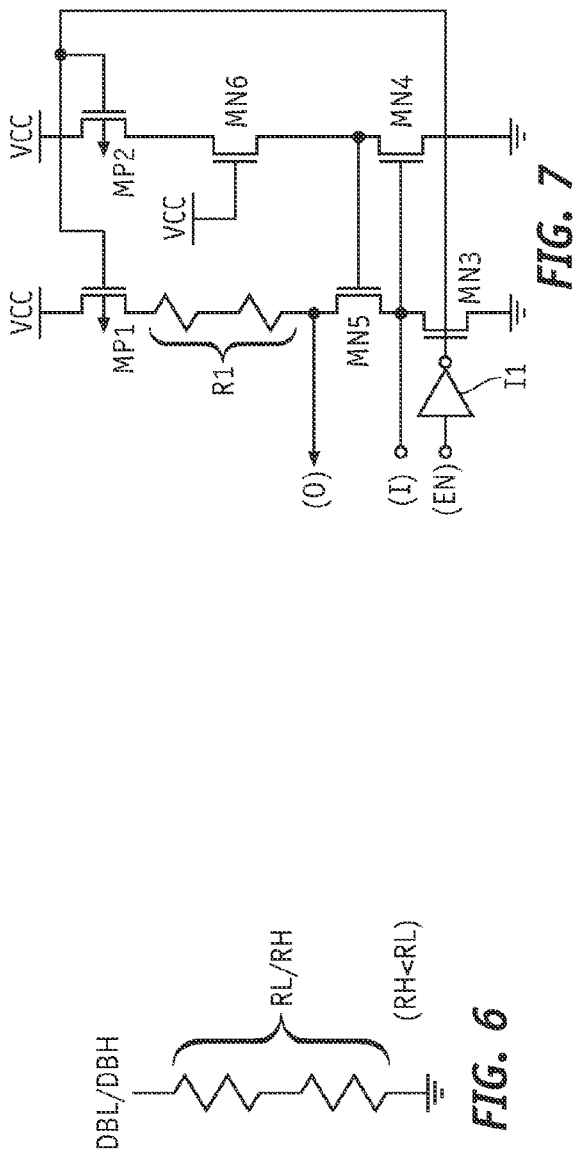
FIG. 7
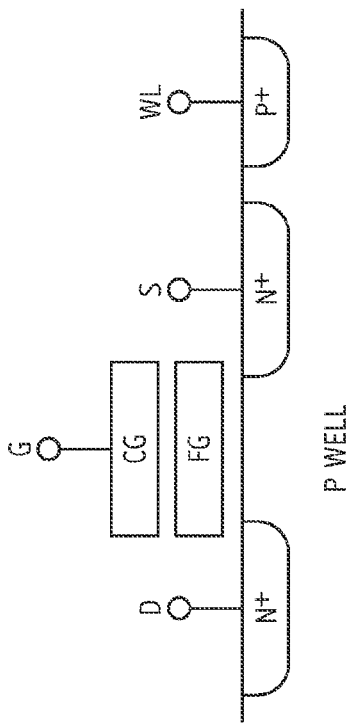
FIG. 4
FIG. 6

METHOD AND APPARATUS FOR REFERENCE CELL ADJUSTING IN A STORAGE DEVICE

CROSS-REFERENCES TO RELATED APPLICATIONS

This is a continuation application of International Application No. PCT/JP2005/001334 filed Jan. 31, 2005, which was not published in English under PCT Article 21(2).

TECHNICAL FIELD

The present invention relates to a storage device provided with an accurate reference cell which detects the data state of a memory cell and a reference cell adjusting method for the storage device.

BACKGROUND

Background Art

Some storage devices are provided with a reference cell for detecting the data state of a memory cell. For example, in a non-volatile storage device, the data state of a memory cell is detected by comparing the size of a current flowing in the memory cell and the current flowing in a reference cell during a verify operation of the memory cell after an erase operation and/or a program operation have been carried out, and during a read operation of data stored therein. It is necessary to adjust the threshold voltage of a non-volatile transistor in the reference cell to an adequate value for accurate verify operations.

Conventionally, reference cells have been adjusted by utilizing a peripheral memory tester device. For example, a bias voltage is applied to a non-volatile transistor of the reference cell and the current flowing therefrom is measured. The bias voltage is then adjusted until a specified current value is detected. Then, the threshold voltage and other pertinent parameters of the reference cells are adjusted until the reference cells provide the specified current value when a predetermined threshold voltage is applied.

In recent years, storage devices have been proposed which include built-in self test ("BIST") circuitry, providing an automatic diagnostic feature wherein testing of a large-scaled and highly integrated memory cell is independently carried out by a built-in control circuit. A memory tester device is no longer required when testing memory cells in such storage devices. Therefore, it is necessary to automatically adjust the reference cell when using a built-in control circuit to adjust the reference circuit.

A method for programming a core cell is disclosed in Japanese Unexamined Patent Publication NO. 2003-323793 ("Patent Document 1"). When several phases of programs are provided in accordance with Patent Document 1 and a selected program phase is passed, the process advances to the next program phase and the programming parameters are reduced. The core cell is programmed by repeating this process until the parameters have been reduced to a predetermined level and then verifying the final phase of the program.

PROBLEMS TO BE SOLVED BY THE INVENTION

Patent Document 1 attempts to resolve the problems of the prior art by repeated programming using successively reduced programming parameters phase by phase in order to not place the core cell into an overprogrammed state by reducing the programming parameters a predetermined amount.

However, even if the programming parameters are reduced phase by phase, the programming parameters not necessarily optimized during the respective phases, and, even if the programming parameters are optimized, the programming status differs between respective core cells or between different storage devices due to unevenness in production. Patent Document 1 discloses that verification of the programming status is determined in response to whether or not a target threshold voltage is reached. Even if verification of the programming status is detected by the final programming phase where the threshold voltage of the core cell exceeds the target threshold voltage, it is not possible to detect the degree by which the threshold voltage of the core cell exceeds the target threshold voltage and, therefore, the threshold voltage of the core cell cannot thereafter be accurately controlled. Thus, the degree of overprogramming of the core cell cannot be controlled, and overprogramming may occur, causing unevenness in the programming status of the core cell.

SUMMARY OF THE INVENTION

Means for Solving the Problems

The invention was developed in view of the above-described background art, and it is therefore an object of the invention to provide a storage device with a plurality of reference states including the lower limit state and the upper limit state when adjusting the reference data state of a reference cell, wherein the storage device is capable of accurately adjusting a reference data state of the reference cell by checking the reference data state of the reference cell, and to provide a method for adjusting the reference cell of the storage device.

A storage device in accordance with the present invention attempting to achieve the object stated above is provided with a reference cell to be referred to when determining the data state of a memory cell, the storage cell including a first reference unit for defining a lower limit state of a reference setting data state of the reference cell, a second reference unit for defining an upper limit state, and a comparator for comparing the reference data state of the reference cell to the lower limit state and the upper limit state.

When adjusting the reference data state of a reference cell in a storage device in accordance with the invention to a reference setting data state, the lower limit state proposed by the first reference unit, the upper limit state proposed by the second reference unit, and the reference data state of the reference cell are compared with each other by a comparator.

Furthermore, a reference cell adjusting method of a storage device in accordance with the invention is provided with a reference cell to be referred to when determining a data state of a memory cell, the method comprising the steps of comparing a reference data state of the reference cell with a lower limit state of a reference setting data state of the reference cell and comparing the reference data state with an upper limit state of the reference setting data state.

In the reference cell adjusting method of the storage device in accordance with the invention, when adjusting the reference data state of a reference cell to the reference setting data state, the reference data state of the reference cell is compared with the lower limit state in the reference setting data state and, at the same time, is compared with the upper limit state in the reference setting data state.

EFFECTS OF THE INVENTION

In accordance with the present invention, when adjusting the reference data state of the reference cell, both the lower limit state and the upper limit state of the reference setting data state are obtained and it is possible to determine whether or not the reference data state has been adjusted between the upper limit state and the lower limit state.

Further, even in a case where the adjusting condition of the reference cell is not optimized or in a case where the states to be adjusted differ due to unevenness of production, the reference data state of the reference cell can be accurately adjusted to the reference setting data state and unevenness in the reference data state of reference cells can be reduced.

BRIEF DESCRIPTION OF THE DRAWINGS

FIG. 4 is a sectional view of a nonvolatile transistor equipped in a reference cell in accordance with an embodiment of the present invention;

FIG. 5 is a view depicting applied states of a bias voltage to the reference cell in respective operation modes in accordance with an embodiment of the present invention;

FIG. 6 is a circuit diagram of the first and the second reference units in accordance with an embodiment of an present invention;

FIG. 7 is a circuit diagram of a sense amplifier in accordance with an embodiment of the present invention;

DETAILED DESCRIPTION OF THE INVENTION

Hereinafter, a detailed description is given of a detailed embodiment with respect to a storage device in accordance with the invention and a reference cell adjusting method therefor based on FIG. 1 through FIG. 10.

In the embodiments of the present invention described herein, a description is given of an example of a nonvolatile storage device which is composed of memory cells provided with nonvolatile transistors having floating gates devices as the storage devices. That is, the storage device is a type of storage device called flash memory. Data is stored as a difference in the threshold voltage value of a memory cell in response to electric charge accumulated in a floating gate of the memory cell by injection of charge into and discharge of charge from the floating gate. The accumulated state of charge, i.e., the data state of the floating gate, is then compared with the reference setting data stored in a reference cell. The reference cell includes a nonvolatile transistor having the same composition as the nonvolatile transistor of the memory cells and electric charge is accumulated in the floating gate in advance of accumulating charge in the memory cells.

The comparison operation (called a verify operation) is carried out by comparing the currents caused to flow from the nonvolatile transistors with each other when the same bias voltage is applied to the nonvolatile transistors of the memory cell and the reference cell. There are reference cells used for verify operations for erasing, programming, soft programming, correction of over erasing, reading, etc. Reference cells having reference setting data states for the respective verify operations stored therein are provided to carry out the verify operations.

Figure 1:
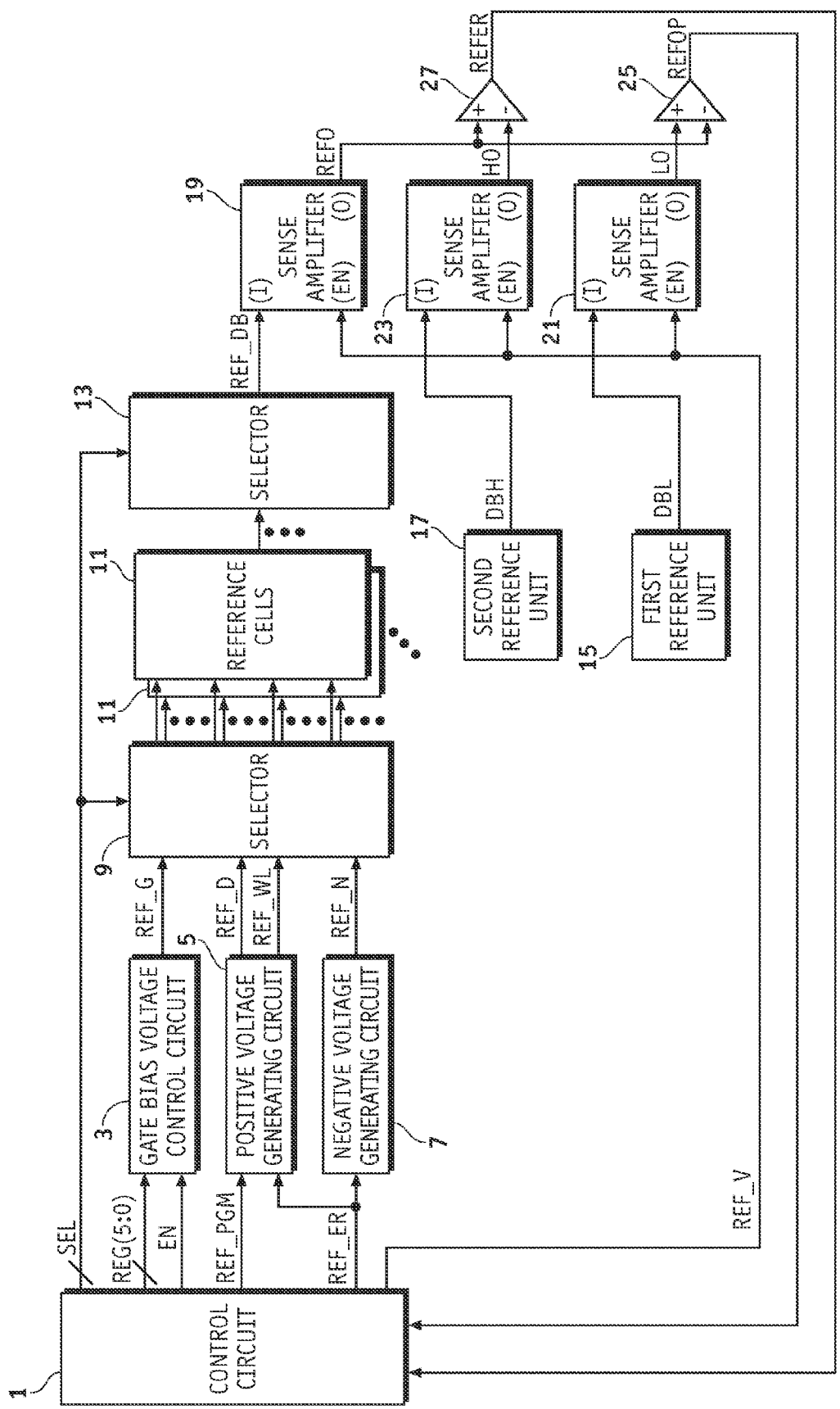
FIG. 1 is a circuit block for adjusting a reference cell in a nonvolatile storage device in accordance with an embodiment of the present invention.

The circuit block diagram of FIG. 1 depicts a circuit portion of the nonvolatile storage device utilized to adjust the reference cells. Reference cells 11 are provided for an erase state, a program state, a soft program state, a correction state of the over erase, a read state (verify operation), etc., respectively, as described above. Or, where the storage device includes a plurality of banks, it is considered that the reference cells 11 are provided for each of the banks. The current caused to flow from the nonvolatile transistor (Refer to FIG. 4) of the reference cell in response to application of a specified voltage bias by a verify operation is compared with the current caused to flow from the nonvolatile transistor of a memory cell (not illustrated) to which the same bias voltage is applied, thereby detecting the data state in the memory cell.

The reference cells 11 are selected by selectors 9 and 13 in order to adjust the respective reference cells 11. The selectors 9 and 13 carry out a selection operation in response to a selection signal SEL outputted by a control circuit 1. The reference data state is adjusted for each of the selected reference cells 11. Adjustment of the reference data states is carried out by accumulating electric charge into the floating gate of the nonvolatile transistor of the reference cells 11 as described later.

The control circuit 1 controls the adjustment operation by outputting various types of control signals while receiving feedback signals of the adjustment result. The control circuit 1 adjusts the reference cells 11 to the reference setting data state as specified in the adjustment procedure described later in FIG. 9. In accordance with an embodiment of the present invention, the control circuit 1 can be, for example, a BIST control circuit wherein a reference cell adjustment feature which adjusts reference cells to the reference data states is included in the self diagnosis feature of the BIST control circuit. Accordingly, prior to testing a memory cell in accordance with the BIST, the reference cells 11 can be adjusted to the reference setting data state to detect the data state in the memory cell.

The control circuit 1 controls a gate bias voltage control circuit 3, a positive voltage generating circuit 5, and a negative voltage generating circuit 7 in addition to the selectors 9 and 13. Also, it controls sense amplifiers 19, 21 and 23 for verification.

The gate bias voltage control circuit 3 outputs an adjustment voltage bias (during a program operation) or a specified voltage bias (during a verify operation) which is applied to the pre-gate terminal REF_G of the reference cells 11 when programming or carrying out verification (reading). The gate bias voltage control circuit 3 is activated by an enable signal EN from the control circuit 1. And, the adjustment voltage bias or specified voltage bias is controlled and varied in response to a bias control signal REG(5:0) having a six-bit composition.

The positive voltage generating circuit 5 supplies a bias of positive voltage to the pre-drain terminal REF_D of the reference cells 11 and the pre-well terminal REF_WL thereof. The positive voltage generating circuit 5 supplies a positive voltage bias to the pre-well terminal REF_WL in response to an erase operation instruction REF_ER from the control circuit 1 and supplies a positive voltage bias to the pre-drain terminal REF_D in response to the program operation instruction REF_PGM from the control circuit 1.

The negative voltage generating circuit 7 supplies a negative voltage bias to the negative power pre-source terminal REF_N of the reference cells 11 in response to the erase operation instruction REF_ER from the control circuit 1. The negative power pre-source terminal REF_N is connected to the gate terminals (G) of the reference cells by a control circuit (not illustrated). When an erase operation is executed, the gate terminals (G) of the reference cells 11 are biased to a negative voltage.

The pre-gate terminal REF_G connected to the gate bias voltage control circuit 3, the pre-drain terminal REF_D and the pre-well terminal REF_WL connected to the positive voltage generating circuit 5, and the negative power pre-source terminal REF_N connected to the negative voltage generating circuit 7 are, respectively, connected to the gate terminals (G), drain terminals (D) and well terminals (WL) of the reference cells 11 as selected by the selector 9.

The reference cells 11 which are selected to apply a voltage bias thereto by the selector 9 are connected to the data bus REF_DB for the reference cell via the selector 13. A data current read from the reference cells 11 to which a bias is applied is caused to flow to the data bus REF_DB via the selector 13 when a verify operation is executed. The data bus REF_DB is connected to the input terminal (I) of the sense amplifier 19. The sense amplifier 19 amplifies the data current in response to the verification control signal REF_V outputted from the control circuit 1 and inputted into the enable terminal (EN). The amplified data current is converted and is outputted as an amplified signal REFO.

In detail, the data bus REF_DB is connected to the drain terminal of the selected nonvolatile transistor(s) in the reference cells 11. As described later, the input terminal (I) of the sense amplifier 19 is maintained at a read verify voltage while applying the read verify voltage to the drain terminal of the selected nonvolatile transistor of the reference cells 11. The current flowing into the data bus REF_DB is determined in response to an accumulated charge volume equivalent to the reference data state stored in the nonvolatile transistor together with the specified voltage bias outputted from the gate bias voltage control circuit 3 as biased to the gate terminal.

The first reference unit 15 and the second reference unit 17 are used for verify operations of the reference cells 11 and detect whether or not the reference data state stored in the reference cells 11 is in the reference setting data state. The first reference unit 15 provides the lower limit state of the reference setting data state and the second reference unit 17 provides the upper limit state of the reference setting data state. The reference setting data state of the reference cells 11 is defined as an allowable current range caused to flow in the nonvolatile transistor when a specified voltage bias and a read verify voltage are applied to a nonvolatile transistor of the reference cells 11. The lower limit state provided by the first reference unit 15 provides the lower limit current of the allowable current range and the upper limit state provided by the second reference unit 17 provides the upper limit current of the allowable current range. Both the lower limit current and the upper limit current are inputted into the input terminals (I) of the sense amplifiers 21 and 23 via the lower limit current bus DBL and the upper limit current bus DBH, respectively. In the sense amplifiers 21 and 23, verification control signal REF_V outputted from the control circuit 1 and inputted into the sense amplification 19 is inputted into the enable terminals (EN). The lower limit and the upper limit currents inputted into the input terminals (I) are amplified in response to the verification control signal REF_V. The amplified lower limit and upper limit currents are converted and outputted as amplification signals LO and HO.

An amplification signal REFO showing the reference setting data state of the reference cells 11 is outputted from the sense amplifier 19 and compared with the amplification signal LO in response to the lower limit current and the amplification signal HO in response to the upper limit current. The comparison is performed by inputting the amplification signal REFO into an inverting input terminal of the comparator 25 and into a non-inverting input terminal of the comparator 27 and inputting the amplification signals LO and HO, respectively, into the non-inverting input terminal of the comparator 25 and into the inverting input terminal of the comparator 27.

Comparison result signals REFOP and REFER of the comparators 25 and 27 are fed back to the control circuit 1. The control circuit 1 then carries out an adjustment operation of the reference cells 11 in response to the comparison result signals REFOP and REFER.

Figure 2:
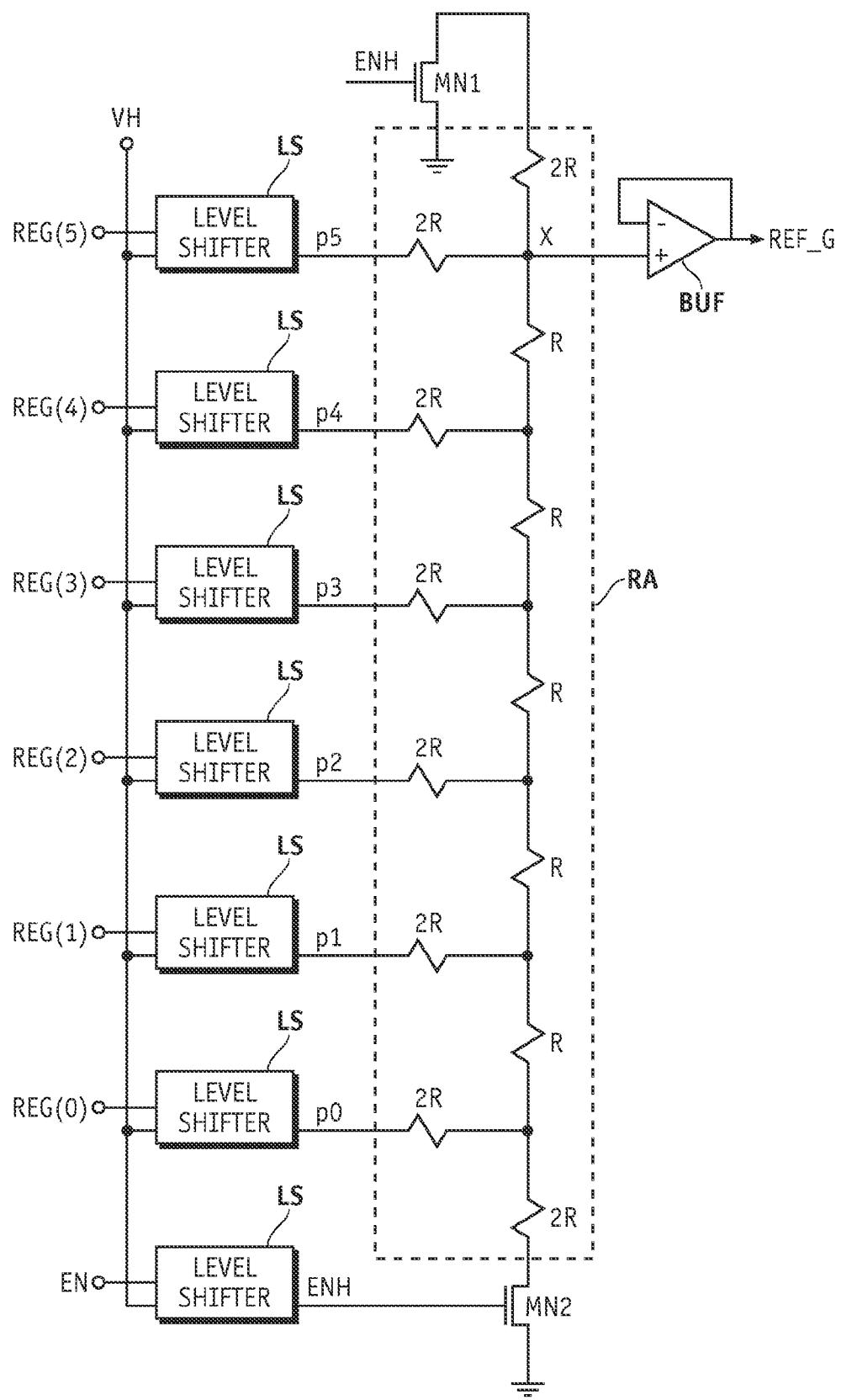
FIG. 2 is a circuit diagram of a gate bias voltage control circuit in accordance with an embodiment of the present invention.

FIG. 2 is a circuit of the gate bias voltage control circuit 3 in accordance with an embodiment of the present invention. The gate bias voltage control circuit 3 is provided with a ladder resistance network RA, a level shifter LS connected to the respective input terminals P0 through P5 of the ladder resistance network RA, NMOS transistors MN1 and MN2 having both terminals of the ladder resistance network RA connected to the grounding potential, and a buffer circuit BUF for receiving an output from an output terminal X of the ladder resistance network RA. In addition, an additional level shifter LS shifts the level of the enable signal EN and outputs the same to the NMOS transistors MN1 and MN2.

The level shifter LS converts the high-level voltage of the bias control signal REG(5:0) and enable signal EN from the power source voltage supplied to the control circuit 1 to the high-level voltage VH. The converted six-bit signal is inputted into the input terminals P0 through P5 of the ladder resistance network RA.

In the ladder resistance network RA, the input terminals P0 through P5 are connected to respective contact points via first resistance elements having a resistance value 2R. Second resistance elements are interposed between the contact points and connected in series, the second resistance elements having a resistance value R. The NMOS transistors MN1 and MN2 are connected via third resistance elements having a resistance value 2R to either ends of the contact points to which the second resistance elements are connected. The other ends of the NMOS transistors (i.e., the source terminals) are connected to the ground. Also, the contact point to which the input terminal P5 is connected via one of the first resistance elements is an output terminal X.

With respect to the bias control signal REG(5:0), the bias control signal REG(0) is LSB and the bias control signal REG(5) is MSB.

Figure 3:
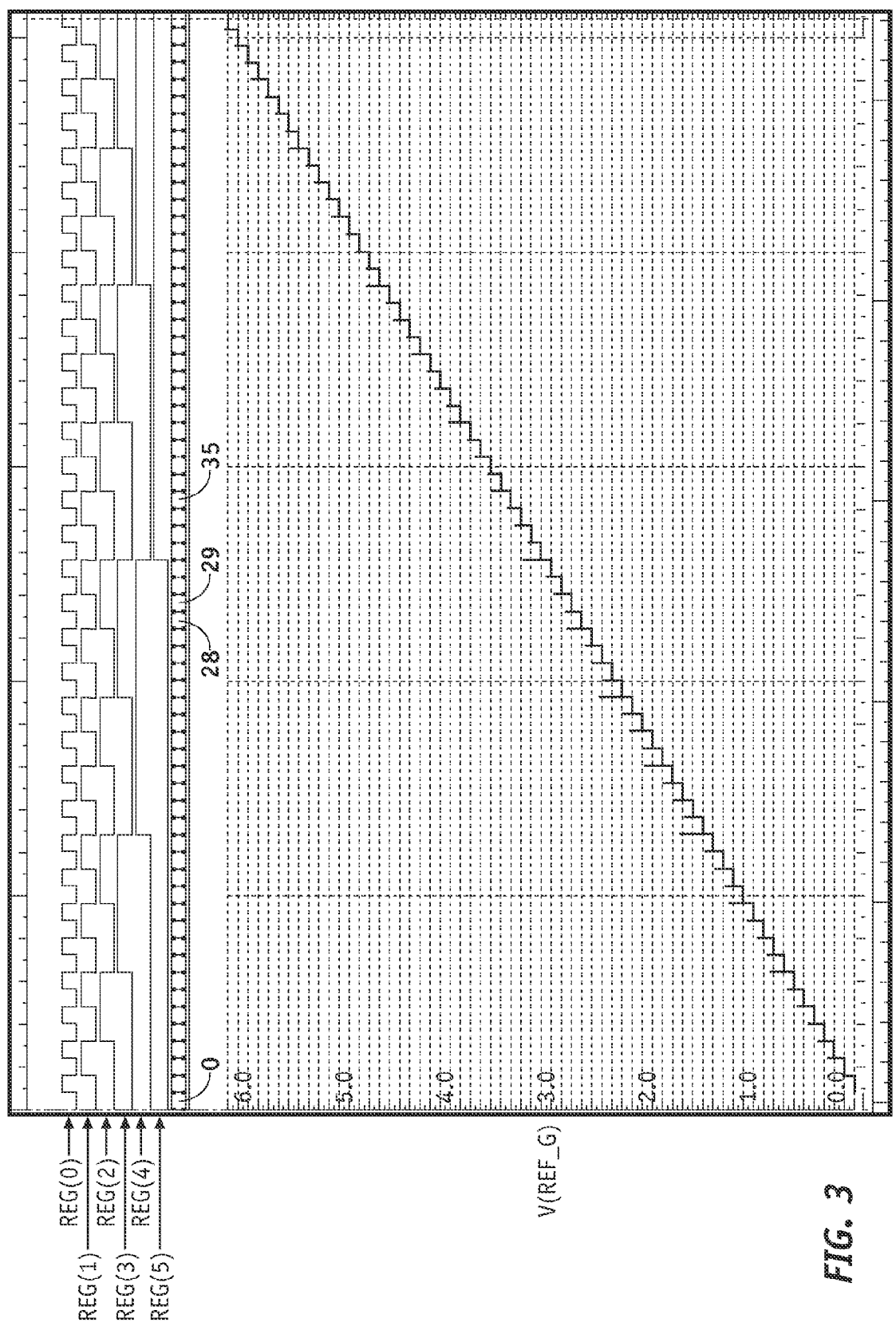
FIG. 3 is a view depicting a bias voltage outputted from the gate bias voltage control circuit in response to a bias control signal (REG(5:0)) in accordance with the embodiment of the present invention.

FIG. 3 depicts bias voltages V (REF_G) which are controlled in response to the bias control signal REG(5:0) and outputted from the gate bias voltage control circuit 3 in accordance with an embodiment of the present invention. As shown in the graph, the bias voltage V (REF_G) increases and decreases in accordance with an increase and a decrease in the six-bit bias control signal REG(5:0).

When all the bits of the six-bit bias control signal REG (5:0) are low, all of the input terminals P0 through P5 of the ladder resistance network RA in FIG. 2 are at ground (0V). At this time, the NMOS transistors MN1 and MN2 are conductive and both terminals of the second resistance elements in the ladder resistance network RA are at ground (0V). Therefore, zero volts (0V), the minimum bias voltage V(REF_G), is outputted at the output terminal X.

When all of the bits of the six-bit bias control signal REF(5:0) are high, all of the input terminals P0 through P5 of the ladder resistance network RA in FIG. 2 are at the high-level voltage VH. As both of the terminals of the second resistance elements are at ground (0V), the voltage at the output terminal X is roughly two-thirds of the high-level voltage VH ((⅔)VH).

During respective phases when the bias control signal REG(5:0) traverses from low to high, the voltage outputted from the output terminal X is 1/64 of (⅔)VH as shown in FIG. 3.

FIG. 4 depicts a nonvolatile transistor of reference cells 11 in accordance with an embodiment of the present invention. The nonvolatile transistor includes N+ diffusion areas in the P well forming a source terminal (S) and a drain terminal (D). A floating gate (FG) and a control gate (CG) are stacked over a channel between the source terminal (S) and the drain terminal (D) with a gate oxidization layer (not illustrated) formed therebetween. The control gate (CG) is the gate terminal (G). Also, the P well is connected to a well terminal (WL) via a P+ diffusion layer.

FIG. 5 depicts a table showing bias conditions applied to the gate, source, drain and well terminals of the nonvolatile transistor shown FIG. 4 during various operations. During an erase operation, wherein a nonvolatile transistor of a reference cell 11 is erased, a negative voltage V (REF_N) generated by the negative voltage generating circuit 7 (FIG. 1) is applied to the gate terminal (G). The source terminal (S) and the drain terminal (D) are placed in a floating state and a positive voltage V (REF_WL) generated by the positive voltage generating circuit 5 (FIG. 1) is applied to the well terminal (WL).

During a program operation, a positive voltage V(REF_G) generated by the gate bias voltage control circuit 3 (FIG. 1) is applied to the gate terminal (G). The source terminal (S) and the well terminal (WL) are held at ground, and a positive voltage V(REF_D) generated by the positive voltage generating circuit 5 is applied to the drain terminal (D). The positive voltage V(REF_G) applied to the gate terminal (G) during the program operation is an adjustment bias voltage outputted from the gate bias voltage control circuit 3 and the voltage level thereof is varied in response to the bias control signal REF (5:0). In this manner, it is possible to control the voltage stress related to the program operation by varying the variable gate bias voltage during the program operation of the reference cells 11.

During the verify operation, a positive voltage V(RD) generated by the gate bias voltage control circuit 3 is applied to the gate terminal (G). The source terminal (S) and the well terminal (WL) are held at ground and a positive voltage V(REF_DB), a read verify voltage applied to the sense amplifier described later in regards to FIG. 7, is applied to the drain terminal (D). The positive voltage V(RD) is a predetermined bias voltage bias outputted from the gate bias voltage control circuit 3, determined in response to the bias control signal REG(5:0).

FIG. 6 is a schematic diagram of a circuit used in the first reference unit 15 and the second reference unit 17 in accordance with an embodiment of the present invention. The circuit includes a resistance element having one end connected to ground and the other terminal connected to either the lower limit current bus DBL or the upper limit current bus DBH. As described later, in order for the sense amplifiers 21 and 23 to keep the lower limit current bus DBL and the upper limit current bus DBH at a specified voltage, the current flowing into the lower limit current bus DBL and the upper limit current bus DBH are predetermined, the current value determined in response to the resistance values RL and RH of the resistance element. The resistance value RH of the resistance element of the second reference unit 17 which outputs the upper limit current is set to be lower than the resistance value RL of the resistance element of the first reference unit 15 which outputs the lower limit current (i.e., RH<RL).

FIG. 7 is a schematic diagram of a circuit used in the sense amplifiers 19, 21, and 23 in accordance with an embodiment of the present invention. The input terminal (I) is connected to the gate terminal of an NMOS transistor MN4 and the enable terminal (EN) is connected to the input terminal of the inverter gate I1. The output terminal of the inverter gate 11 is connected to the gate terminals of an NMOS transistor MN3 and PMOS transistors MP1 and MP2. The source terminals of the PMOS transistors MP1 and MP2 are connected to the power source voltage VCC and the source terminals of the NMOS transistors MN3 and MN4 are connected to ground.

The drain terminal of the PMOS transistor MP1 is connected to the output terminal (O) and connected to the drain terminal of the NMOS transistor MN5 via the resistance element R1. The source terminal of the NMOS transistor MN5 is connected to the input terminal (I) and the drain terminal of the NMOS transistor MN3, as well as connected to the gate terminal of the NMOS transistor MN4.

The drain terminal of the PMOS transistor MP2 is connected to the gate terminal of the NMOS transistor MN5 and the drain terminal of the NMOS transistor MN4 via the NMOS transistor MN6. The gate terminal of the NMOS transistor MN6 is connected to the power source voltage VCC.

An amplification operation is commenced by the sense amplifiers by inputting a high-level verification control signal REF_V into the enable terminal (EN). A low-level signal is supplied into the gate terminals of the NMOS transistor MN3 and PMOS transistors MP1 and MP2 via the inverter gate 11, wherein the NMOS transistor MN3 is placed into a non-conductive state and the PMOS transistors MP1 and MP2 are placed into conductive states.

With the PMOS transistor MP2 in a conductive state, a high potential voltage level is applied to the gate terminal of the NMOS transistor MN5 via the NMOS transistor MN6, thereby also placing the NMOS transistor MN5 into a conductive state. A current channel is formed from the PMOS transistor MP1, which is in a conductive state, to the reference cells 11 or the first reference unit 15 and the second reference unit 17 via the resistance element R1 and the NMOS transistor MN5, passing through the input terminal (I) and data bus REF_DB or the lower limit and upper limit current bus DBL/DBH. The current in the current channel is determined in accordance with the resistance value of the resistance element R1, the conductive state of the NMOS transistor MN5 and the nonvolatile transistor of the reference cells 11 or the resistance elements of the first reference unit 15 and the second reference unit 17.

The current is controlled to have an almost constant current value by the input terminal (I) being held at an almost constant voltage level by the feedback configuration composed of the NMOS transistors MN4 and MN5. That is, as the current capacity of the NMOS transistor MN5 increases, a larger current flows from the input terminal (I) to the reference cells 11 or the first reference unit 15 and the second reference unit 17 and the voltage level of the input terminal (I) increases. An increase in the voltage level at the input terminal (I) results in an increase in the voltage level of the gate terminal of the NMOS transistor MN4, thereby expanding the current capacity of the NMOS transistor MN4. An increase in the current capacity of the NMOS transistor MN4 causes the voltage level at the gate terminal of the NMOS transistor MN5 to drop, and the current capacity of the NMOS transistor MN5 is decreased. On the other hand, if the current capacity of the NMOS transistor MN5 decreases, the voltage level of the input terminal (I) decreases. The dropping voltage level at the input terminal (I) causes the current capacity of the NMOS transistor MN4 to decrease. Therefore, the voltage level at the gate terminal of the NMOS transistor MN5 increases and the current capacity of the NMOS transistor MN5 increases.

The feedback configuration composed of the NMOS transistors MN4 and MN5 is one example of the voltage application portion in accordance with an embodiment of the present invention. This configuration is an example of a case where the voltage V(I) at the input terminal (I) is maintained at an almost constant voltage level and is applied to one end of the drain terminal or resistance element of a memory cell when carrying out a verification operation.

Accordingly, when the charge volume accumulated in the nonvolatile transistor of the reference cells 11 is increased, or when the first reference unit 15 (having the greater resistance value R) is connected, the current volume provided in response to the read verify voltage V(I) applied to the input terminal (I) is limited. The voltage volume drop from the PMOS transistor MP1 via the resistance element R1 is thereby decreased and a high voltage level signal is outputted from the output terminal (O).

On the other hand, when the charge volume accumulated in the nonvolatile transistor of the reference cells 11 is decreased or when the second reference unit 17 (having the smaller resistance value R) is connected, the current volume provided in response to the read verify voltage V(I) applied to the input terminal (I) is increased. Consequently, the voltage volume drop from the PMOS transistor MP1 via the resistance element R1 is increased and a low voltage level signal is outputted from the output terminal (O).

A pause is brought about in response to a low-level verification control signal REF_V inputted at the enable terminal (EN). In response to such low-level verification control signal REF-V, a high-level signal is supplied to the gate terminals of the NMOS transistor MN3 and PMOS transistors MP1 and MP2 via the inverter gate I1. The NMOS transistor MN3 is thus placed into a conductive state and the PMOS transistors MP1 and MP2 are placed into a non-conductive state.

By comparing amplification signals REFO, LO and HO outputted from the output terminal (O) of the respective sense amplifiers 19, 21, and 23 by means of the comparators 25 and 27 (FIG. 1), it is possible to check the state of the reference cells 11 with respect to the respective states of the first reference unit 15 and the second reference unit 17.

Figure 8:
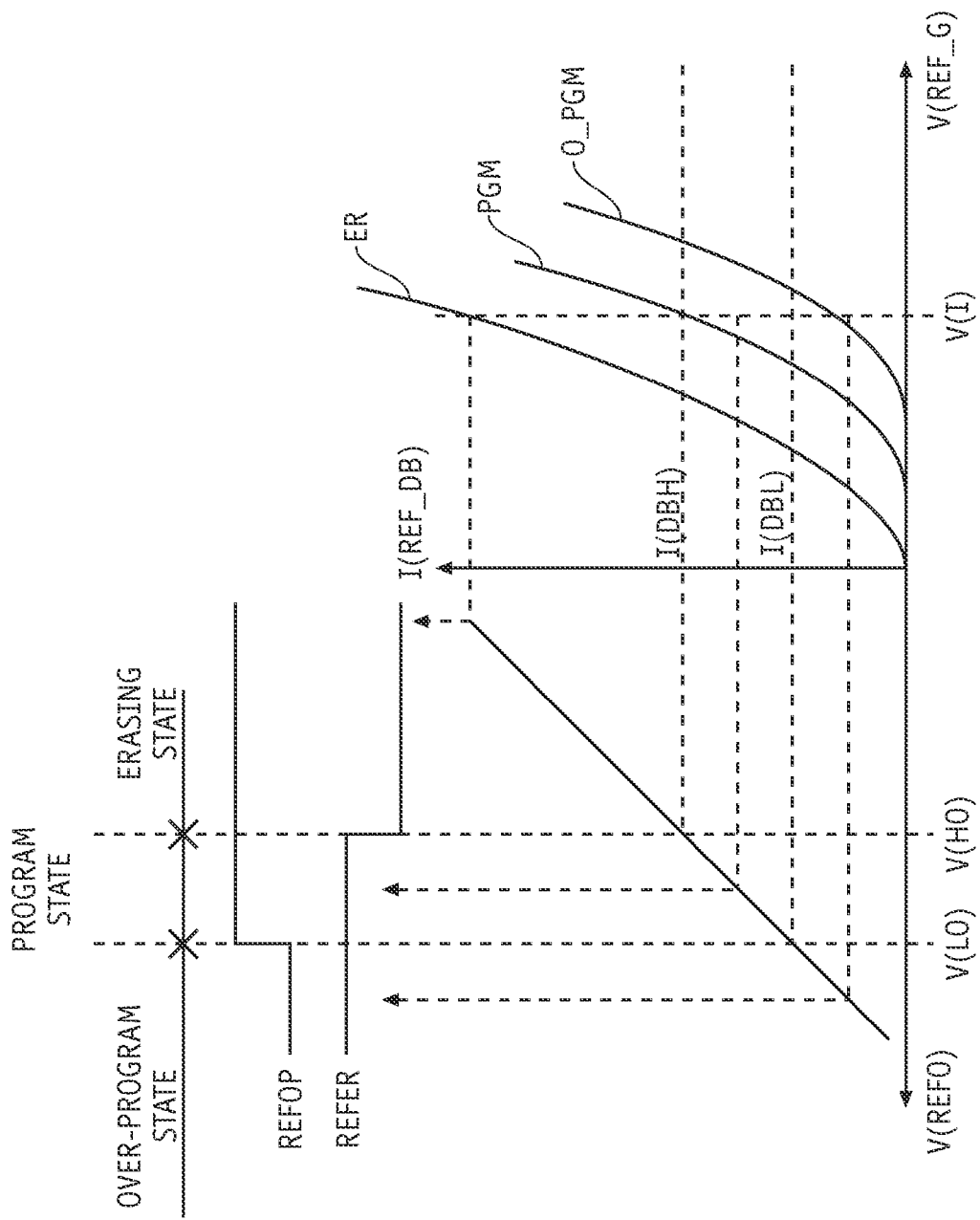
FIG. 8 is a view depicting the relationship between states of the reference cell and comparison result signals (REFOP, REFER) in accordance with an embodiment of the present invention.

The states of a non-volatile transistor of the reference cells 11 in accordance with the embodiment of the present invention are depicted in FIG. 8 in relation to a graph of the characteristics of the nonvolatile transistor wherein the abscissa (x-axis) indicates the voltage level V (REF_G) of the pre-gate terminal REF_G and the ordinate (y-axis) indicates the current I(REF_DB) level of the data bus REF_DB during a verification operation. That is, the graph shows three states: an erase state ER where a current exceeding the upper limit current I (DBH) set by the second reference unit 17 flows with respect to the read verify voltage V(I); a program state PGM where a current between the lower limit current I(DBL) and the upper limit current I(DBH) set by the first reference unit 15 and the second reference unit 17, respectively, flows; and an over-program state O_PGM where a current less than the lower limit current I(DBL) set by the first reference unit 15 flows.

The current of the reference cells 11 with respect to the read verify voltage V(I) of the sense amplifiers 19, 21, and 23 is compared with the lower limit current I(DBL) and the upper limit current I(DBH). In the erase state ER, a current greater than the upper limit current I(DBH) flows. The voltage thereof is converted by the sense amplifiers 19 and 23 to invert the relationship of the currents, whereby the amplification signal REFO is reduced to a lower voltage level than the amplification signal HO and the comparison result signal REFER is set to a low level by the comparator 27. In the over-program state O_PGM, a current less than the lower limit current I(DBL) flows. The voltage is converted by the sense amplifiers 19 and 21 to invert the relationship of the currents, whereby the amplification signal REFO is raised to a voltage level higher than the amplification signal LO and the comparison result signal REFOP is switched to a low level by the comparator 25. In the program state PGM, an intermediate current between the lower limit current I(DBL) and the upper limit current I(DBH) flows, wherein the comparison result signals REFER and REFOP are both switched to a high level by the comparators 25 and 27.

Thus, FIG. 8 depicts the states where the relationship of the current values are inverted when the voltage is converted by the sense amplifiers 19, 21 and 23. The x-axis of the graph indicates the voltage value V(REFO) of the amplification signal REFO and the y-axis indicates the current I (REF_DB) flowing in the data bus REF_DB.

Based on these curves, it can be determined whether or not the reference setting data state of the reference cells 11 has been adjusted to be within the allowable current range (i.e., between the lower limit current I(DBL) and the upper limit current I(DBH)).

Figure 9:
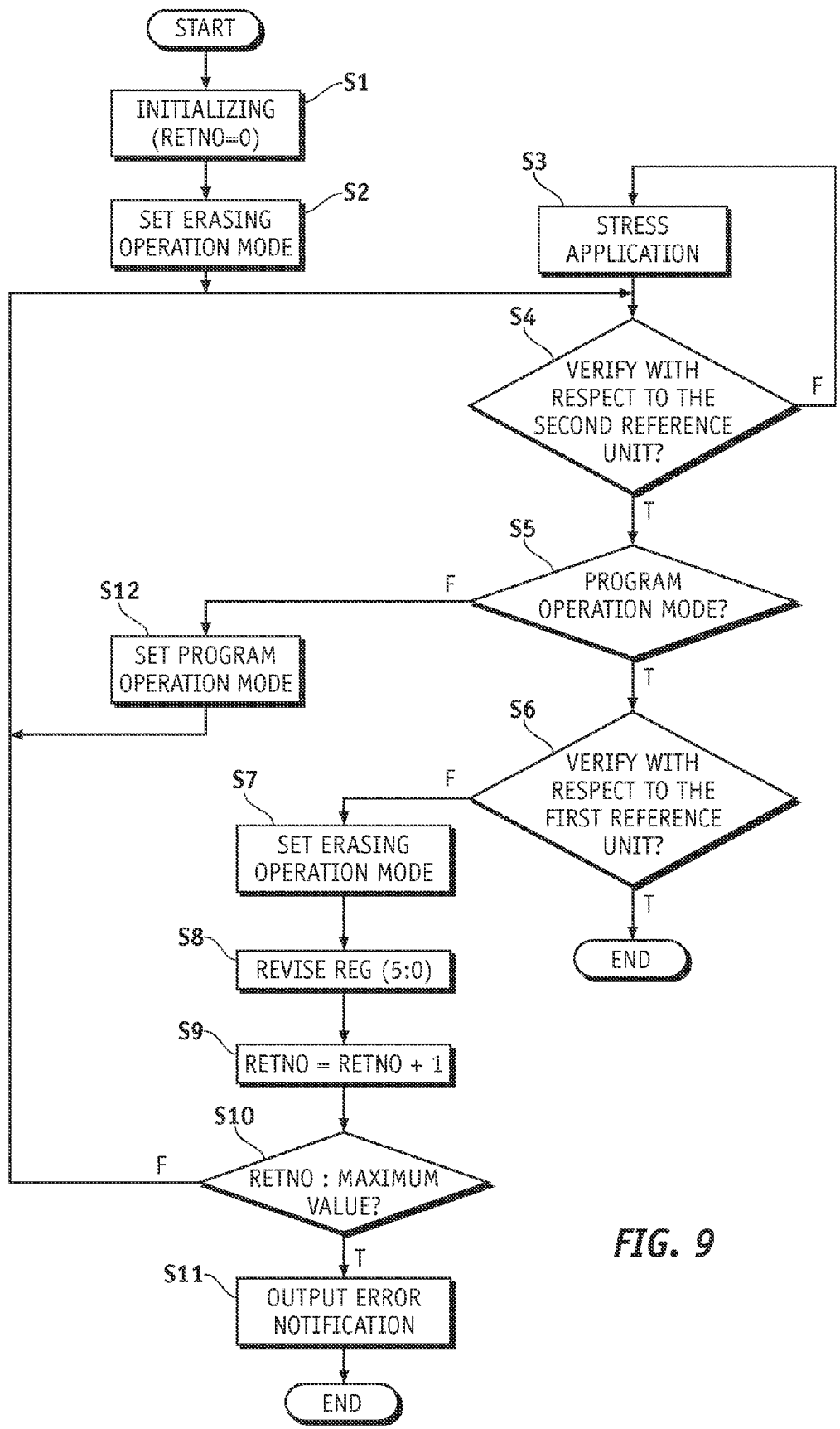
FIG. 9 is a flowchart depicting a method for adjusting the reference cell in accordance with an embodiment of the present invention.

FIG. 9 depicts a flowchart of a method for adjusting the reference cells 11 in accordance with an embodiment of the present invention. First, the process is initialized (S1), thereby initializing the repetition variable RETNO by which the maximum number of times of repetition in the adjustment routine is counted (that is, RETNO=0). Next, an erase operation mode is set as an operation mode (S2). When adjusting the reference cells 11, an erase operation of the nonvolatile transistor is carried out and the charge of the floating gate is discharged.

When commencing application of an actual adjustment voltage bias after the erase operation mode is set, it is preferable that the reference data state of the reference cells 11 is checked. A verify operation is therefore carried out in connection with the second reference unit 17 (S4). When the current of the reference cells 11 is smaller than the upper limit current I (DBH) (S4:F), it is determined that the nonvolatile transistor of the reference cells 11 has not reached an erased state, and voltage stress is applied (S3). The voltage stress applied is a stress in the erase operation as depicted in FIG. 5. When the current flowing into the reference cells 11 is larger than the upper limit current I(DBH) (S4:T), it is determined that the nonvolatile transistor of the reference cell is in an erased state. Since, in this phase, the erase operation mode has been established, and the mode is not the program operation mode (S5:F), the program operation mode is set as the next operation mode (S12), and the process returns to Step S4.

After the operation mode is set to the program operation mode (S12), a verify operation is carried out with respect to the second reference unit 17 at the step (S4) When the current in the reference cells 11 is larger than the upper limit current I(DBH) (S4:F), it is determined that the nonvolatile transistor of the reference cells 11 has not reached the upper limit current and is not in an allowable current range during the program state. Thus, voltage stress is applied (S3). When it is detected that the current in the reference cells 11 is smaller than the upper limit current I (DBH) (S4:T) while the mode is set to the program operation mode (S5:T), a next verify operation is carried out.

The next verify operation is carried out with respect to the first reference unit 15 (S6). If the current in the reference cells 11 is larger than the lower limit current I(DBL) (S6:T), it is determined that the nonvolatile transistor of the reference cell is in an allowable current range during the program state and the adjustment of the reference cells 11 is finished.

If the current in the reference cells 11 is smaller than the lower limit current I(DBL) (S6:F), the nonvolatile transistor of the reference cells 11 is operating at a current level lower than the lower limit current of the allowable current range during the program state. This indicates that the nonvolatile transistor is an over-program state. In this case, since it has been determined that the nonvolatile transistor has not been adjusted to a normal program state, a process of re-adjustment is carried out in accordance with the procedure of step (S7) and the steps thereafter.

At Step (S7), the operation mode is set to an erase operation mode. Next, the bias control signal REG(5:0) outputted by the control circuit 1 is reset to a value smaller by one bit (S8). One is added to the value of the repetition variable RETNO (S9). Then, it is determined whether RETNO is less than the maximum number of times of repetition (S10:F). If so, the process shifts back to Step (S4). Since the erase operation mode is set, an erase operation is carried out by the verify operation (S4) and voltage stress is applied (S3). After the erase operation is completed, the program operation mode is established in accordance with step (S12), wherein the voltage stress (S3) for program and the verify operations (S4, S6) are carried out.

The above-described readjustment step is carried out within the maximum number of times of repetition (S10:F) until the current in the reference cells 11 is within the allowable current range when carrying out a verify operation. When the number of times of re-adjustment reaches the maximum number of times of repetition (S10:T), an error process is carried out (S11). An error is outputted (S11) indicating that adjustment of the reference cells 11 has not been completed.

Figure 10:
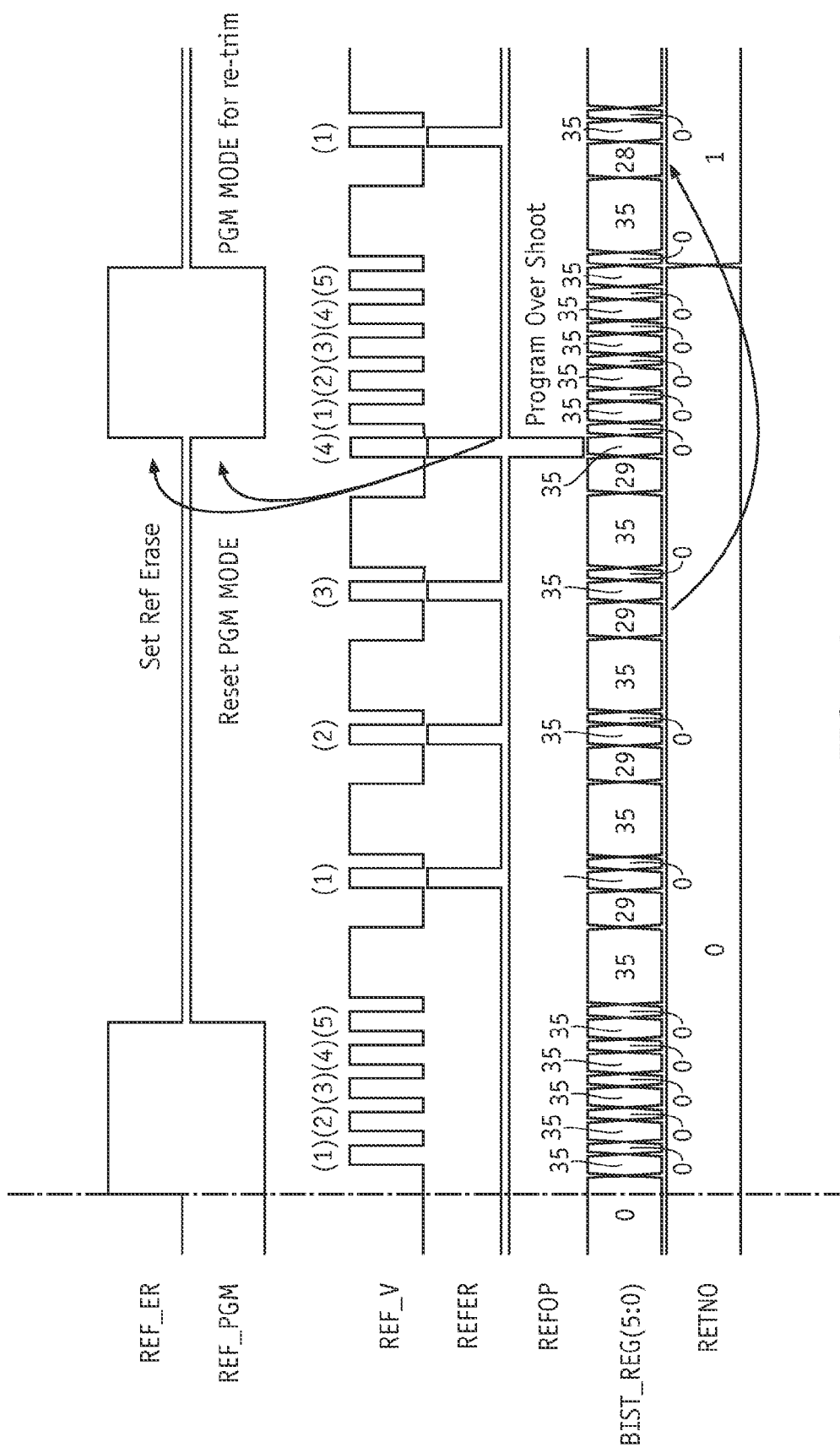
FIG. 10 is a timing chart depicting adjustment operations of the reference cell in accordance with an embodiment of the present invention.

FIG. 10 is a timing waveform depicting an adjustment operation of the reference cells 11 in accordance with the embodiment of the present invention. Herein, it is assumed that the storage device is provided with five banks and the respective banks include reference cells (1) through (5). The drawing depicts operation waveforms for carrying out adjustment for the respective reference cells (1) through (5). When commencing the adjustment operation, an erase operation is executed in response to a high-level erase operation instruction REF_ER from the control circuit 1. Application of voltage stress and a subsequent verify operation are carried out for each of the reference cells 11 by the selectors 9 and 13.

The verify operation is carried out in response to a high level verification control signal REF_V. The gate terminal is biased by a specified voltage bias controlled by the bias control signal REG(5:0) (which becomes a decimal value of thirty-five) and a verify operation is executed. The comparison result signal REFER is switched low whenever it is confirmed by the verify operation that the selected reference cells 11 are in an erase state. The erase operations are carried out one after another as the reference cells 11 are selected. In addition, the voltage stress to the gate terminal during the erase operation is a negative voltage. Since a negative voltage generated by the negative voltage generating circuit 7 is applied, a decimal value of zero is outputted for the bias control signal REG(5:0). Also, although not depicted in FIG. 10, the gate bias voltage control circuit 3 is disabled by a low-level enable signal EN.

After the erase operation is completed for all of the reference cells (1) through (5), a high-level program operation instruction REF_PGM is outputted from the control circuit 1, shifting the process to the program operation. As in the erase operation, the program operation is carried out for each of the reference cells 11 by the selectors 9 and 13. Application of a voltage stress and a subsequent verify operation are carried out for each of the reference cells 11 as selected by the selectors 9 and 13.

The voltage stress is then applied while the gate terminal is biased by an adjustment bias voltage controlled by the bias control signal REG(5:0) (which becomes a decimal value of twenty-nine). After the adjustment bias voltage is applied for a specified period of time, the reference cells 11 are selected one after another and a program operation is executed, followed by the verify operation.

The verify operation is carried out in response to a high level of the verification control signal REF_V following application of the adjustment bias voltage. The gate terminal is biased by a specified voltage bias controlled by the bias control signal REG(5:0) which becomes 35 in a decimal system value, and the verify operation is carried out. Whenever the program state is confirmed by a verify operation with respect to a selected one of the reference cells 11, both the comparison result signals REFER and REFOP are entered into a high level, whereby it is confirmed that the reference cells 11 have been programmed within the allowable current range. Reference cells 11 are selected one after another in response to a normal program state being confirmed, and the program operation is executed (in FIG. 10, reference cells (1) through (3)).

Thus, as the program state of the reference cells 11 is entered into an over-program state, the current from the reference cells 11 has a smaller current value than the lower limit current I(DBL), and the comparison result signal REFOP is switched low.

The control circuit 1 that has received the high-level comparison result signal REFER and the low-level comparison result signal REFOP shifts to a process of re-adjustment. An erase operation is carried out with the erase operation instruction REF_ER kept at the high level and the program operation instruction REF_PGM kept at the low level, wherein the reference cell is first initialized. Although the program operation is carried out after the erase operation, in this case the control circuit 1 outputs a value subtracted by one to a value twenty-nine in the last program operation with the value of the bias control signal REG(5:0) defined as a decimal value of twenty-eight. The adjustment bias voltage outputted from the gate bias voltage control circuit 3 is reduced by an amount of (⅔)VH×(1/96) from the last voltage bias as depicted in FIG. 3. The voltage stress to the reference cells 11 is mitigated during the program operation, which makes it possible to further smoothly program the reference cells 11 and apply excessive stress which can prevent overprogramming. Simultaneously, one is added to the variable RETNO to control the number of times the adjustment routine is repeated. Further, the variable RETNO is not specifically described in terms of the circuits, which is a variable processed in the control circuit 1. Alternatively, if a counter circuit or the like is provided in the control circuit 1 or separately therefrom, it is possible to control the number of times of repetition of the adjustment routine.

As described, in order to adjust the reference data state of a reference cell, a program operation is carried out for a nonvolatile transistor of the reference cell and a charge amount accumulated in the floating gate (FG) is adjusted. At this time, in accordance with the present embodiment, it is possible to confirm the lower limit state and the upper limit state of the set reference data state in the reference cell (i.e., to confirm whether or not the current I(REF_DB) generated by application of a specified bias voltage to the nonvolatile transistor of the reference cell has been adjusted to be between the lower limit current I(DGL) and the upper limit current I(DBH) of the allowable current range). Where the charge in the floating gate (FG) is accumulated by executing a program operation after the erase operation is initialized, since the current I(REF_DB) of the reference cell is detected in relation to the upper limit current I(DBH) as well as the lower limit current (DBL), it is possible to detect not only an insufficient program state but also an excessive program state (i.e., an over-program state).

Where the adjustment condition of the reference cells is not optimized and where the adjusted condition differs due to unevenness in production of the reference cells, it is possible to accurately adjust the operational current of the reference cells to within the allowable current range and it is possible to reduce unevenness of the reference cells.

Also, as a result of the program operation in accordance with an embodiment of the present invention, it is possible to easily detect that the reference cells have been over-programmed and, at the same time, it is possible to supply an accurate adjustment bias voltage to the reference cells when carrying out re-adjustment in response to over-programming being detected. That is, since the voltage value of the adjustment bias voltage outputted from the gate bias voltage control circuit 3 can be variably controlled in response to the value of the six-bit bias control signal REG(5:0), the adjustment voltage bias can be reduced by a ratio of a step obtained by dividing the adjustment bias voltage by the maximum value of 64 (i.e., $2^6$) by simply subtracting one from the decimal system value of the bias control signal REG(5:0) when over-programming is detected. That is, it is possible to weaken the voltage stress during the program operation by a 1/64 step, and it is possible to prevent the occurrence of over-programming resulting from excessive stress application.

In addition, the invention is not limited to the above-described embodiment and the invention can be subjected to various improvements and modifications within the scope of the claims below and their equivalents without departing from the spirit of the invention.

For example, in the operation timing waveform depicted in FIG. 10, a description was given of a case where, when over-programming occurs as a result of a program operation, the bit value of the bias control signal REG(5:0) is reduced from twenty-nine to twenty-eight by subtracting a decimal value of one. However, the invention is not limited to this embodiment. It is possible to determine an adequate ratio of subtraction other than that disclosed.

Also, in FIG. 10, a description was given of a case where all of the reference cells (1) through (5) are processed again for re-adjustment. However, the invention is not limited thereto and the re-adjustment may be carried out only for a reference cell which has been determined to be over-programmed.

In addition, a description was given of a case where, when confirming the reference data state of a reference cell, the current caused to flow by the reference cell during a verify operation is compared with the lower limit current and the upper limit current. However, such a construction may be employed in which the current is compared with an intermediate current in addition to the lower limit current and the upper limit current, thereby making it possible to further accurately grasp the state of the reference cell during the program operation.

Furthermore, a description was given of a case of providing a plurality of values for the lower limit current and the upper limit current during the program operation. However, it is considered that, during an initializing erase operation prior to a program operation, a verify operation can be carried out for a plurality of reference current values including an intermediate current in addition to the lower limit current and the upper limit current. Thereby, the reference cell state can be accurately controlled during the erase operation and it is possible to prevent unevenness during the erase state, such as over-erasing.

What is claimed is:

1. A storage device having a reference cell to be referred to when determining the data state of a memory cell, the storage device comprising:
   a first reference unit for defining a lower limit state for the reference cell;
   a second reference unit for defining an upper limit state for the reference cell;
   a comparator for comparing a reference data state of the reference cell to the lower limit state and the upper limit state and determine whether the reference data state of the reference cell is below the lower limit state, above the upper limit state, or between the lower limit state and the upper limit state; and
   a control unit coupled to the comparator for adjusting the reference data state in response to comparison of the reference data state to the lower limit state and the upper limit state,
   wherein the control unit initializes the reference cell when the comparator determines that the reference data state is below the lower limit state or above the upper limit state and thereafter relaxes an adjustment bias voltage applied to the reference cell and adjusts the reference data state.

2. The storage device of claim 1 wherein:
   the memory cell and the reference cell comprise nonvolatile transistors;

the reference data state is generated to provide current to the nonvolatile transistors within an allowable current range when a specified bias voltage is applied to the reference cell; and the lower limit and the upper limit states correspond to a lower limit current and an upper limit current within the allowable current range.

3. The storage device of claim 2 wherein:

the first reference unit comprises a first resistance element for generating the lower limit current; and the second reference unit comprises a second resistance element for generating the upper limit current.

4. The storage device of claim 3 wherein:

each of the first resistance element and the second resistance element is connected to a ground potential for maintaining a read verify voltage.

5. The storage device of claim 2 further comprising:

a bias voltage control unit operating in response to a bias control signal, the bias control signal composed of a plurality of bits for defining the specified bias voltage and for providing the adjustment bias voltage to the nonvolatile transistor of the reference cell when adjusting the reference data state thereof.

6. The storage device of claim 5 wherein:

the bias voltage control unit includes a ladder resistance network.

7. The storage device of claim 5:

wherein the control unit is further coupled to the bias voltage control unit for providing the bias control signal and for adjusting the current flow when the specified voltage bias is applied to the nonvolatile transistor within the allowable current range, and wherein the control unit initializes the reference cell by initializing the nonvolatile transistor of the reference cell when the comparator determines that the nonvolatile transistor has been adjusted outside the allowable current range and thereafter updates the bias control signal to reduce the voltage value of the adjustment bias voltage and adjusts the current flow again.

8. The storage device of claim 7 wherein:

the control unit adjusts the current of the nonvolatile transistor within the allowable current range by performing an erase operation of the nonvolatile transistor and thereafter performing a program operation thereof.

9. The storage device of claim 8 wherein:

the control unit determines that the erase operation is completed when the current of the nonvolatile transistor when applying the specified voltage bias is greater than the upper limit current, and wherein the control unit determines that the program operation is completed when the current of the nonvolatile transistor when applying the specified voltage bias is between the lower limit current and the upper limit current.

10. The storage device of claim 8 wherein:

the control unit determines that the nonvolatile transistor is over-programmed when the current of the nonvolatile transistor when the specified voltage bias is applied is smaller than the lower limit current, and wherein the control unit in response to determining that the nonvolatile transistor is over-programmed decreases the program current after the erase operation and performs the program operation again.

11. A reference cell adjusting method of a storage device having a reference cell to be referred to when determining a data state of a memory cell, the method comprising the step of adjusting a reference data state of the reference cell, wherein the step of adjusting the reference data state of the reference cell comprises the steps of:

applying an adjustment bias voltage to the reference cell to generate the reference data state;

comparing the reference data state of the reference cell with a lower limit state of the reference cell;

comparing the reference data state with an upper limit state of the reference cell;

reducing the adjustment bias voltage to a reduced adjustment bias voltage in response to determining from the comparing steps that the reference data state is below the lower limit state or above the upper limit state;

initializing the reference cell in response to determining from the comparing steps that the reference data state is below the lower limit state or above the upper limit state; and applying the reduced adjustment bias voltage to the reference cell after the initializing step.

12. The reference cell adjusting method of the storage device of claim 11 wherein:

the memory cell and the reference cell comprise nonvolatile transistors; and the lower limit and the upper limit states are a lower limit current and an upper limit current of an allowable current range, wherein the step of applying an adjustment bias voltage comprises the step of applying a specified voltage bias to a gate terminal of the nonvolatile transistor of the reference cell.

13. The reference cell adjusting method of the storage device of claim 12 further comprising the step of controlling the specified voltage bias and the adjustment bias voltage to be applied when adjusting the nonvolatile transistor in response to a bias control signal composed of a plurality of bits.

14. The reference cell adjusting method of the storage device of claim 12 wherein the step of adjusting the reference data state comprises the step of adjusting the current of the nonvolatile transistor when the specified voltage bias is applied in the allowable current range, and wherein the step of reducing the adjustment bias voltage comprises the step of reducing the adjustment bias voltage when the nonvolatile transistor adjusted at the step of applying the adjustment bias voltage is outside the allowable current range as a result of the comparing step, and wherein the step of initializing the reference cell comprises the step of initializing the nonvolatile transistor when the nonvolatile transistor adjusted at the step of applying the adjustment bias voltage is outside the allowable current range as a result of the comparing step.

15. The reference cell adjusting method of the storage device of claim 14 wherein the step of applying the adjustment bias voltage and the step of applying the reduced adjustment bias voltage comprise the step of performing a program operation; and wherein the step of initializing the nonvolatile transistor comprises the step of performing an erase operation.

16. The reference cell adjusting method of the storage device of claim 15 wherein the step of performing the erase operation comprises the step of determining that the erase operation is complete when the current of the nonvolatile transistor when the specified voltage bias is applied is greater than the upper limit current; and wherein the step of performing the program operation comprises the step of determining that the program operation is complete when the current of the nonvolatile transistor when the specified voltage bias is applied is between the lower limit current and the upper limit current.

17. The reference cell adjusting method of the storage device of claim 15 wherein the step of applying the adjustment bias voltage comprises the step of:

determining that the nonvolatile transistor adjusted at the step of applying the adjustment bias voltage is outside the allowable current range in response to the current of the nonvolatile transistor when the specified voltage bias being applied is smaller than the lower limit current.

* * * * *